United States Patent
Kirby et al.

(10) Patent No.: US 7,095,351 B2
(45) Date of Patent: Aug. 22, 2006

(54) DIGITAL-TO-ANALOG CONVERTER STRUCTURES

(75) Inventors: Patrick C. Kirby, Raheen (IE); Colin G. Lyden, Baltimore (IE); Tudor M. Vinereanu, Frenches Quay (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/048,374

(22) Filed: Feb. 1, 2005

(65) Prior Publication Data

US 2006/0061500 A1 Mar. 23, 2006

Related U.S. Application Data

(60) Provisional application No. 60/611,469, filed on Sep. 20, 2004.

(51) Int. Cl.
*H03M 1/78* (2006.01)
*H03M 1/68* (2006.01)

(52) U.S. Cl. ................ 341/154; 341/145; 341/120

(58) Field of Classification Search ........... 341/118, 341/120, 144, 145, 154
See application file for complete search history.

(56) References Cited

U.S. PATENT DOCUMENTS

| 5,119,094 A * | 6/1992 | Brokaw ............. 341/154 |
| 5,764,174 A | 6/1998 | Dempsey et al. |
| 6,509,857 B1 * | 1/2003 | Nakao ............. 341/153 |

* cited by examiner

*Primary Examiner*—Howard L. Williams
(74) *Attorney, Agent, or Firm*—Wolf, Greenfield & Sacks, P.C.

(57) ABSTRACT

A DAC architecture is described. The architecture is specifically adapted to provided an analog voltage output based on a digital input word. The architecture includes a resistor ladder configuration sub-divisible into a first component, adapted to convert a lower part of the input word, and a second component adapted to convert an upper part of the input word. The DAC is calibrated such that the first component can be used to tune the output of the second component on selection of specific segment from the second component.

22 Claims, 9 Drawing Sheets

DIGITAL-TO-ANALOG CONVERTER STRUCTURES

FIELD OF THE INVENTION

The present invention relates to digital-to-analog converters (DACs) and in particular to DAC structures implemented using resistive ladder configurations. The invention more particularly relates to DAC structures based on an R-2R configuration.

BACKGROUND OF THE INVENTION

DAC structures are well known in the art. They are used to convert an input digital signal, usually provided in the form of a binary code, to an analog output signal- either in the form of a corresponding voltage or current. This is achieved using switches or a network of resistors or current sources. An example of known DAC structures is given in U.S. Pat. No. 5,764,174 (U.S. Pat. No. '174) of Dempsey et al which is assigned to the Assignee of the present application, the content of which is incorporated herein by reference. U.S. Pat. No. '174 describes an R-2R ladder structure which includes a plurality of legs. Each leg contributes towards the resolution of the device, such that the more legs that are provided in the structure the better the resolution. However, as one adds more legs to the ladder structure it is also necessary to add a plurality of corresponding switches, which need to be scaled appropriately. The addition of switches is not a trivial activity, as each new switch needs to be scaled appropriately to the preceding switch. This scaling of the switches is addressed by the invention of U.S. Pat. No. '174 which provides a control circuit such that the on resistance of the switches is controlled with regard to a reference value. However, if one wants high resolution from the DAC there is still the problem of keeping the switches in reasonable operating parameters and in providing sufficient area on the circuit layout to accommodate for the large number of switches.

A further issue with high resolution DACs is that the linearity and monotonicity of the DAC is limited by component matching. Random component mismatch can reduce the monotonicity and linearity of the DAC structure. This problem has traditionally been countered either by laser trimming components to adjust their values or by incorporating calibration circuitry on board.

There is therefore a need to provide a DAC configuration which is adapted to provide for high DAC resolution and which facilitates calibration of DAC linearity errors.

SUMMARY

Accordingly, a first embodiment of the invention provides a digital to analog converter (DAC) adapted to convert a digital input word to an analog output voltage signal, the word being divisible into an upper part and a lower part, the DAC including a first component including a resistor ladder DAC controlled by the lower part of the word and generating an output voltage, and a second component including a resistor ladder DAC controlled by the upper part of the word and generating an output voltage. The second component is segmented, at least one of the individual segments having a weighting less than 1 LSB of the upper part of the word and the first component is further adapted to tune the output of the second component in response to a selection of a segment of the second component.

Preferred features of the invention are provided by the independent claims which are appended hereto. Advantageous embodiments are provided in the dependent claims.

The ladder may typically be provided in a R-2R topology or modified version thereto. In such a modification of the standard R-2R structure some of the link 'R' resistors are removed and the remaining DAC resistors scaled. This increases the impedance of the first component or lower DAC section at the expense of resistor area but reduces the current flowing in the DAC and also reduces the effect of switch and wiring non-idealities relative to the resistor value in the lower part of the DAC.

By coupling a lower part of the DAC to a current source, the current source being configured to inject a scaled current (related to the reference) into a node of the R-2R ladder the present invention provides for a minimization of the total DAC area for a given resolution and reduces the switch scaling problem. Such an injection may be added to any node of the ladder but typically is coupled to the top of a termination resistor.

These and other features of the present invention will be better understood with reference to the drawings that follow.

BRIEF DESCRIPTION OF THE DRAWINGS

The present invention will now be described with reference to the accompanying drawings in which.

DETAILED DESCRIPTION OF THE DRAWINGS

Figure 1:
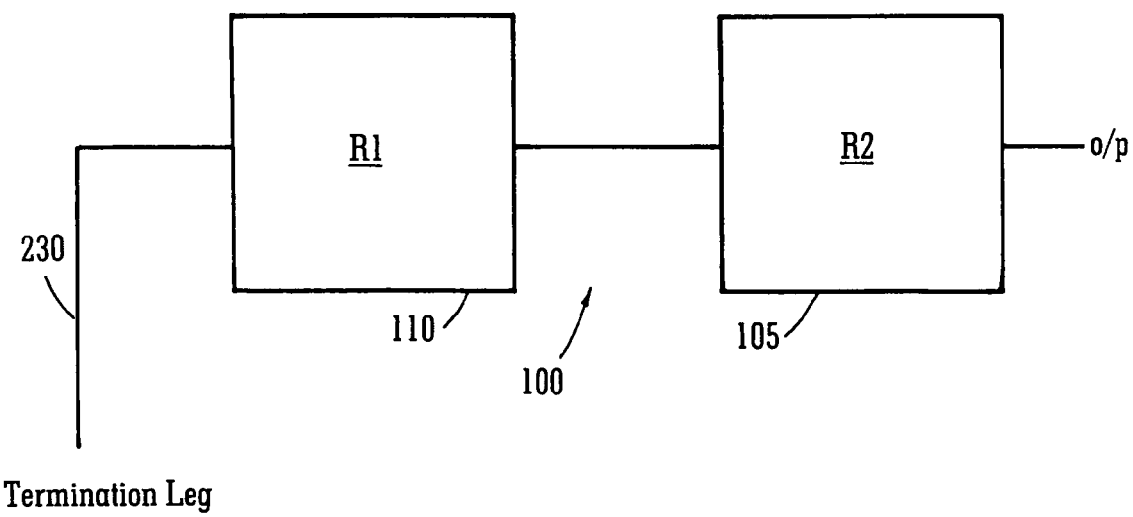
FIG. 1 is a schematic of a DAC configuration according to a first illustrative embodiment for practicing the invention.

The present invention will now be described with reference to FIGS. 1 to 6. As shown in FIG. 1, in accordance with a first illustrative embodiment of a DAC practicing the present invention, a digital-to-analog converter 100 adapted to convert an input digital signal to an analog output signal is provided. The converter includes an upper part 105 that is responsible for converting a first portion of the digital input word comprising the most significant bit (MSB) of the digital input word and a lower part 110 responsible for converting the remaining portion (i.e. the least significant bits LSBs) of the digital input word. The resistance of the upper part, R2, can be less than that of the resistance of the lower part, R1. It will be understood that the DAC of the present invention converts an input word to a single analog output corresponding to that input word. For the sake of explanation, however, the input word can be considered as being divisible into two sub-words: a first sub-word containing the least significant bits (LSBs) of the input word and the second sub-word containing the most significant bits (MSBs) of the input word, each of the two sub-words being converted by a part of the DAC. In accordance with the present invention, the lower part not only provides the corresponding analog output voltage signal for the LSB of the input word but also may be used to tune the upper part.

Figure 2:
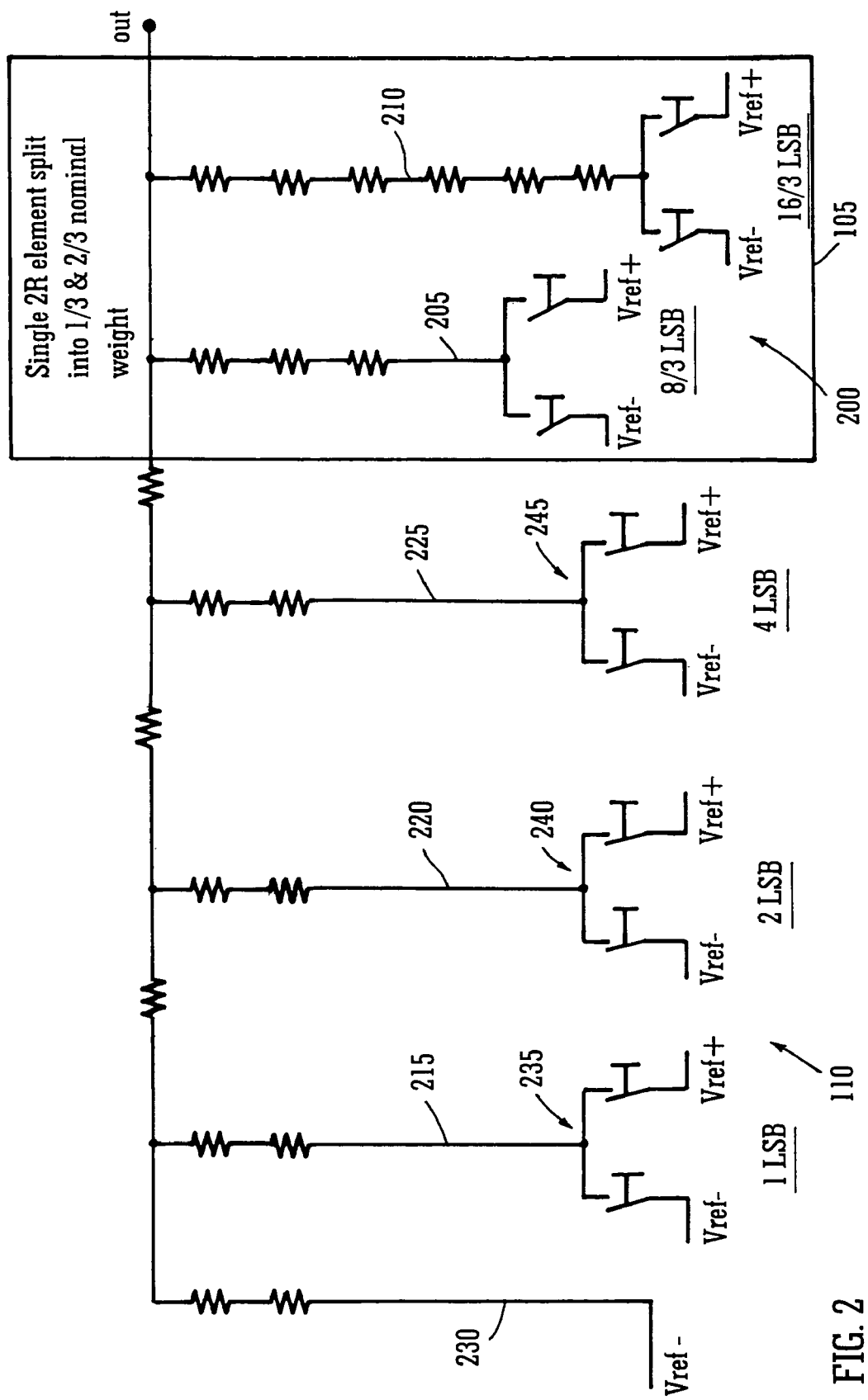
FIG. 2 is an example of a 4-bit DAC architecture according to the embodiment of FIG. 1.

As shown in FIG. 2, which it will be appreciated is an exemplary embodiment of the configuration of FIG. 1 as implemented as a 4-bit DAC, the upper portion 105 includes a first set of segments 200, shown here as two segments 205, 210. The lower part is provided as three legs 215, 220, 225 in a traditional R-2R configuration, with each leg of the lower part providing 1, 2 or 4 LSBs contributing towards the output of the DAC. A termination leg 230 is coupled to Vref−, typically a ground signal. Each of the three legs of the lower part are switchably coupled via switches 235, 240, 245 respectively between Vref− and Vref+.

The effect of switching each segment of the set of the upper part on the output of the DAC corresponds to the effect of switching multiples of one bit from the lower part of the digital input word (which is equivalent to a weighting less than one LSB of the upper part of the word) In the example of FIG. 2 for a 4-bit DAC, the first segment is provided with a weighting of 8/3 LSBs and the second a weighting of 16/3 LSBs (being equivalent to 1/3 and 2/3 the nominal weight of the bit of the upper part of the word). When both of the segments of the upper part are switched together, the effect is equal to 8 LSB as in a standard R-2R arrangement. But these elements can also be switched independently giving the effect on the output of 8/3 LSBs and 16/3 LSBs. As such this set of segments can be thought of as provided a switched resistance whose effect on the DAC output straddles the effect of the preceding leg. Taking account of the matching of the resistors (which will be know for each process), the DAC structure of FIG. 2 can be modified to guarantee that internally within the DAC there is a switch combination which will approximate all the desired output voltages. The calibration algorithm then becomes a technique of mapping input codes to the switch code which gives the desired output.

FIG. 2 also indicates the bit weight of each switchable element. This is the effect on the DAC output when each bit is switched. As expected for a 4-bit DAC, the output when all elements are switched is equal to 15 LSBs. Table 1 below shows two possible switching sequences which equal or approximate the desired transfer function Output=Code*LSB. In the absence of resistor errors, sequence 1 gives the ideal output for each input code. In the presence of positive DNL errors at the midscale transition from code 7 to code 8 (8/3 or 16/3 weight or both weights too big) then this DAC cannot be corrected if switching sequence 1 is used. If the second sequence is selected then, in the absence of mismatch it approximates the ideal output for each input code. In the presence of a positive DNL error due to either the 8/3 or 16/3 segment or both being too big, the code loaded to the LSB section of the DAC can be modified to correct the output, i.e. load 10001 for code 7 instead of code 10010 to correct for an error of +1 LSB DNL. This basic scheme can be extended to calibrate high resolution DACs.

TABLE 1

| Input Code | Option 1 switching sequence | Option 2 switching sequence |
| --- | --- | --- |
| 0 | 00000 | 00000 = 0 |
| 1 | 00001 | 00001 = 1 |
| 2 | 00010 | 00010 = 2 |
| 3 | 00011 | 00011 = 3 |
| 4 | 00100 | 00100 = 4 |
| 5 | 00101 | 00101 = 5 |
| 6 | 00110 | 00110 = 6 |
| 7 | 00111 | 10010 = 7.333 |
| 8 | 11000 | 10011 = 8.333 |
| 9 | 11001 | 10100 = 9.333 |
| 10 | 11010 | 10101 = 10.333 |
| 11 | 11011 | 11011 = 11 |
| 12 | 11100 | 11100 = 12 |
| 13 | 11101 | 11101 = 13 |
| 14 | 11110 | 11110 = 14 |
| 15 | 11111 | 11111 = 15 |

It will be appreciated therefore that if the second switching sequence is used, that the legs of the lower part of the DAC are used to tune the output of the DAC when a segment from the set of the upper part has been selected. The calibration algorithm that is used is such to ensure that the lower part is never implemented in full deflection,—i.e. that the legs of the lower part are either all on or all off. As such, the legs of the lower part may be used to tune or adapt the contribution from the segments of the upper part to provide the desired output from the DAC for the input digital word, and preferably can be used to ensure that there is no deviation from +DNL<1 LSB The use of a configuration such as that shown in FIG. 2 is advantageous in applications where there is a requirement for digital calibration to have a positive DNL<1 LSB. This is difficult to guarantee in a high resolution standard R-2R structure due to resistor matching limitations. If the midscale transition from 0111 to 1000 in a standard 4-bit R-2R DAC has a positive DNL>1 LSB, then there is a desired output voltage which cannot be obtained no matter what code is loaded to the DAC. In the example of FIG. 2, the R-2R structure has been modified to add redundancy. In a standard N bit R-2R structure there are N switchable elements giving $2^N$ possible outputs. In accordance with the present invention, there are N+X switchable elements giving $2^{(N+X)}$ possible outputs. These additional switchable elements are structured and sequenced in such a way as to guarantee that positive DNL<1 LSB.

As shown in FIG. 2, the lower part is preferably provided in a ladder configuration. The present invention also provides for modifications to such conventional ladder configurations. In such a modification of a standard R-2R structure, shown in FIG. 3, some of the link 'R' resistors, between adjacent legs, are removed and the remaining DAC resistors scaled, i.e. those resistors provided on the legs of the ladder between the termination leg and the removed resistor. In this instance, the number of resistors is increased twofold so that there is provided a 2R-4R configuration. This increases the impedance of these lower legs at the expense of resistor area but reduces the current flowing in the DAC and also reduces the effect of switch and wiring non-idealities relative to the resistor value in these lower legs of the DAC. By doubling the values of the resistors, most of the voltage in the legs is dropped across the resistors as opposed to the switches. As a result the contribution of the resistance of the switches to the legs is less, and their associated scaling problem contributes less in error than heretofore achievable.

As has been described heretofore, the lower part of the DAC is preferably provided with a termination leg, the termination leg being directly coupled to a reference signal, typically ground. It is also known to couple the termination leg of such ladder configurations to ground via a switch, but in accordance with preferred embodiments of the present invention, the coupling is direct as opposed to via the switch.

Figure 4:
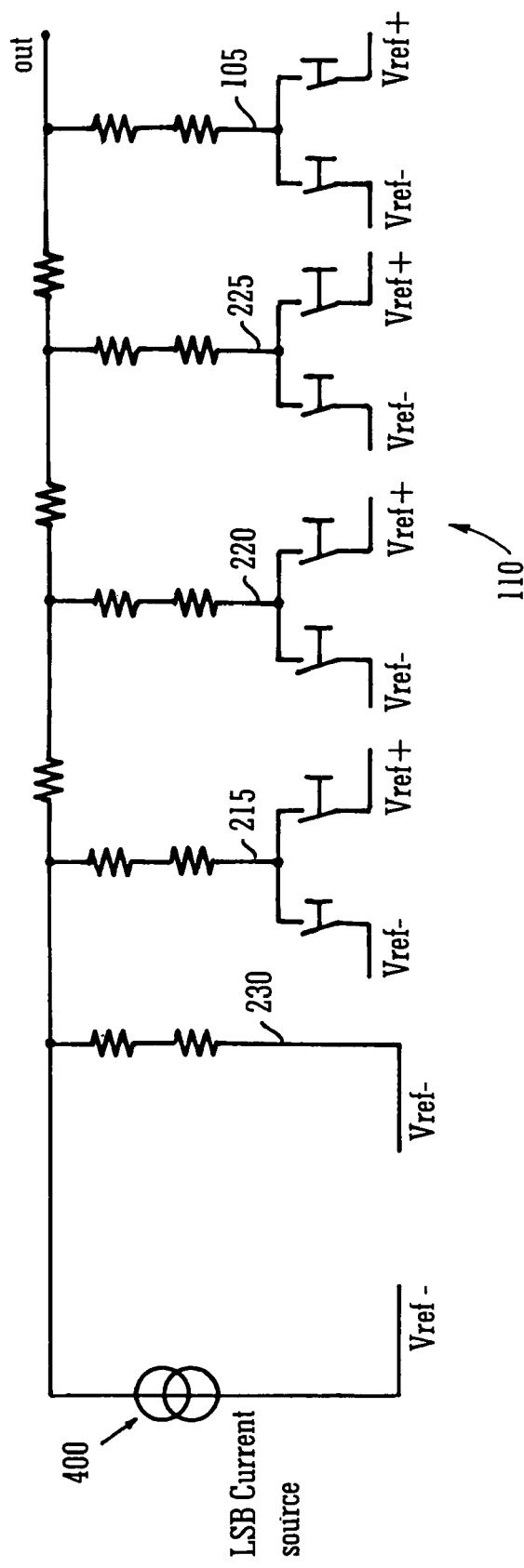
FIG. 4 is an example of a DAC architecture in accordance with a third embodiment;.

In accordance with a third embodiment, a modification to a ladder configuration is provided where in the ladder is additionally coupled to a current source 400, the current source being configured to inject a scaled current (related to the reference) into a node of the R-2R ladder. This minimizes total DAC area for a given resolution and reduces the switch scaling problem. Such an injection may be added to any node of the ladder but typically is coupled to the top of a termination resistor, as is shown in FIG. 4. It is preferable to couple the current source to the termination leg as the available headroom within the DAC architecture is greatest here and as such it is easier to design the current source. The combination of an R-2R DAC ladder architecture and the current source DAC enables one to extend the resolution of the R-2R DAC without increasing the number of resistors and switches. This serves to extend the resolution provided by such architectures. It will be appreciated that the value of the current injected into the termination leg is typically of the order of microamps, whereas if the current was injected into other legs of the ladder, a signal of much reduced magnitudes would typically be required.

Figure 5:
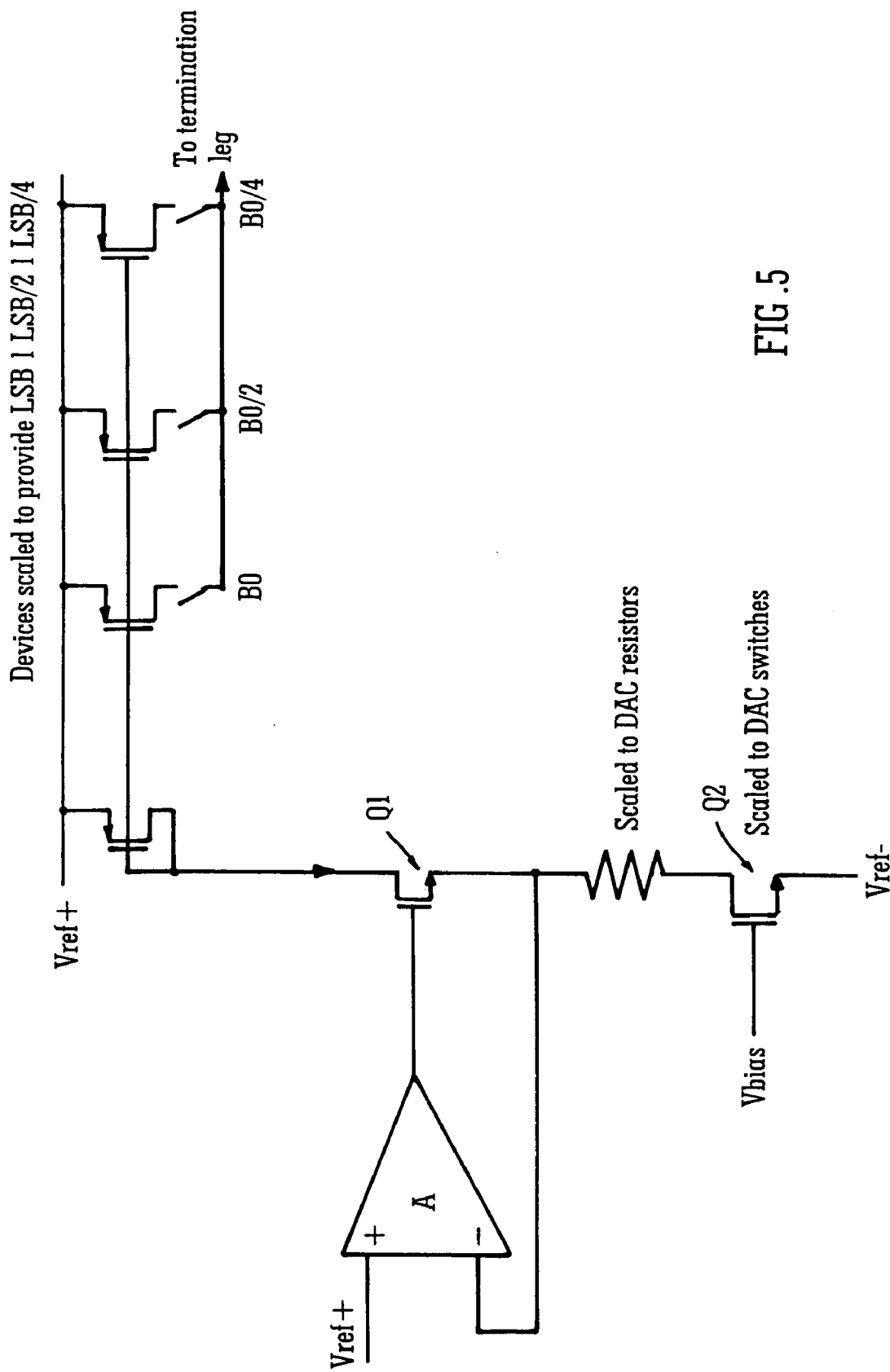
FIG. 5 is an example of a current source that may be used with the embodiment of FIG. 4.

FIG. 5 shows an example of the type of current source circuit that may be used in implementations of DACs according to the present invention. It will be appreciated however that the structure and components illustrated are exemplary of the type of configuration that may be considered by a person skilled in the art to provide a current injection to the resistor ladder of FIG. 4. In this example, an amplifier A is provided whose non-inverting input is coupled to Vref+. The inverting input is coupled in a feedback configuration to a resistor and a switch Q2, the values of which are scaled to the values of the switches and resistors in the legs of the lower part of the DAC. The gate of the switch Q2 is controlled by a bias voltage Vbias, so as to achieve the scaling effect. The output of the amplifier controls the gate of a second switch Q1, the source of which controls a master MOSFET device of a mirror arrangement. The mirror is adapted to provide for the selective coupling of currents—shown here as B0, B0/2 and B0/4 into the termination leg of the lower part of the DAC—not shown in this Figure, but were previously shown in FIG. 3. The selective switching achieves the injection of current equivalent of 1 LSB, 1 LSB/2 and 1 LSB/4 respectively. Such injection of current is advantageous in that it improves the resolution of the DAC without requiring additional legs within the resistor ladder DAC arrangement.

Figure 3:
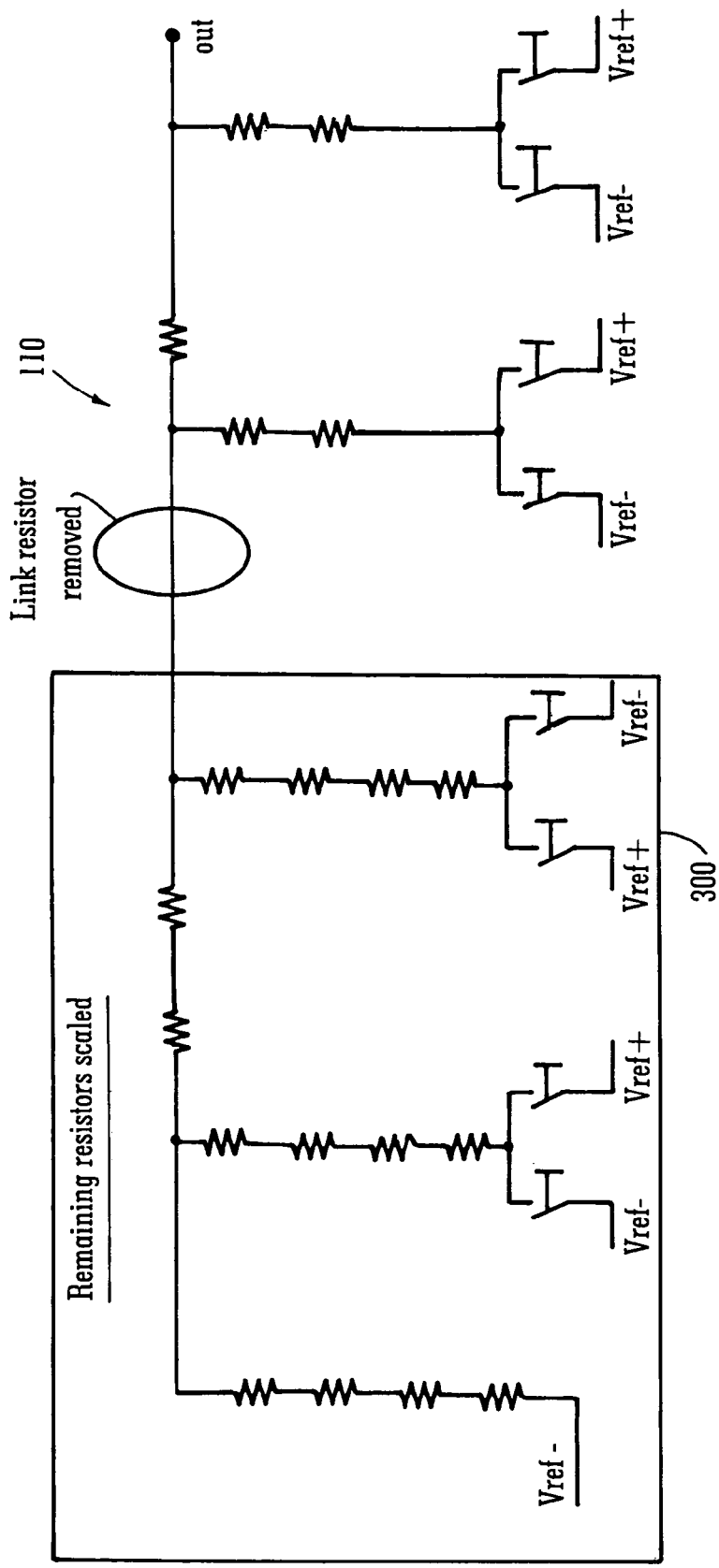
FIG. 3 is an example of a DAC architecture in accordance with an illustrative second embodiment;.
Figure 6A:
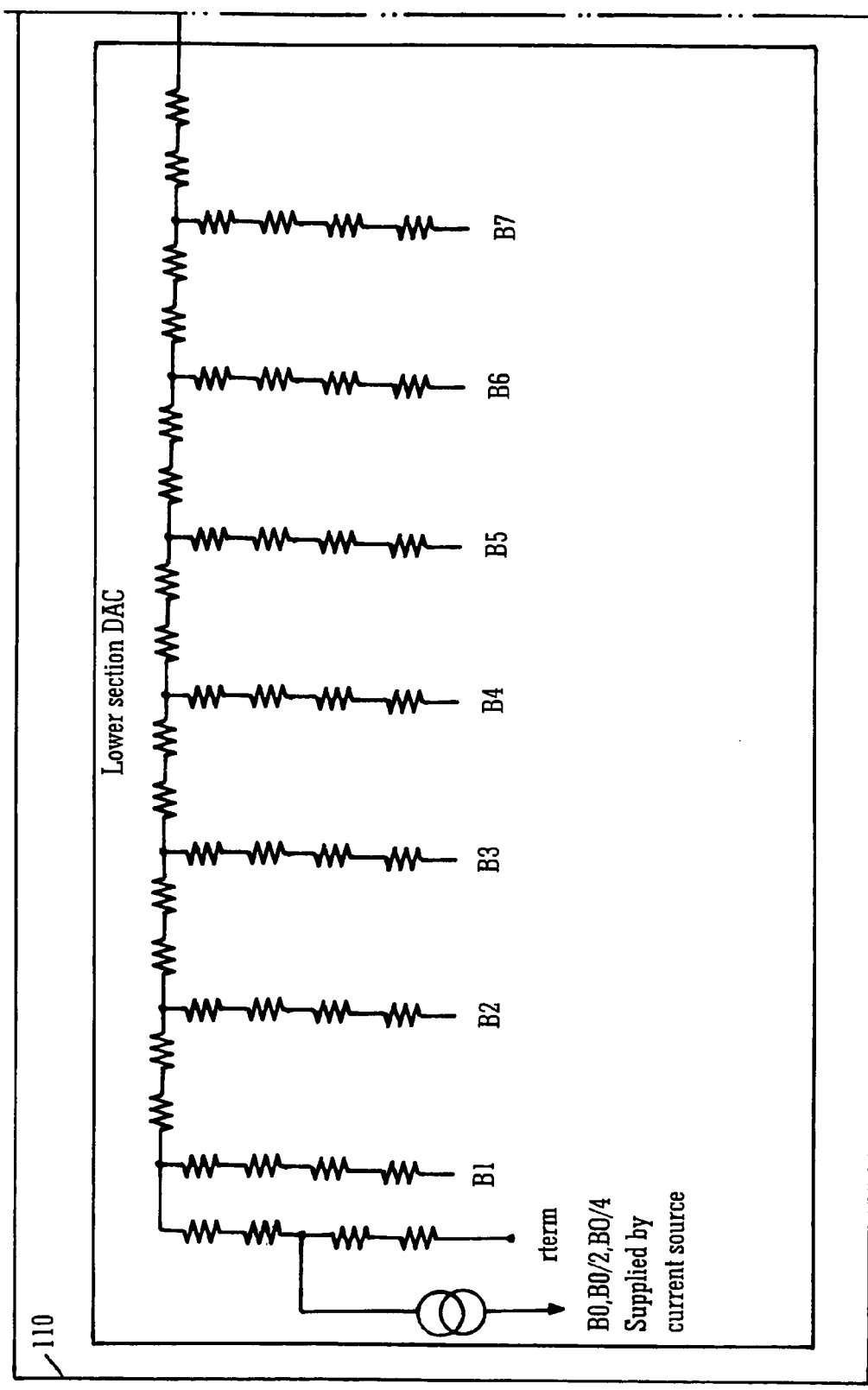
FIGS. 6A, 6B and 6C are schematic of a DAC architecture incorporating all three embodiments illustrated in FIGS. 2, 3 and 4.
Figure 6B:
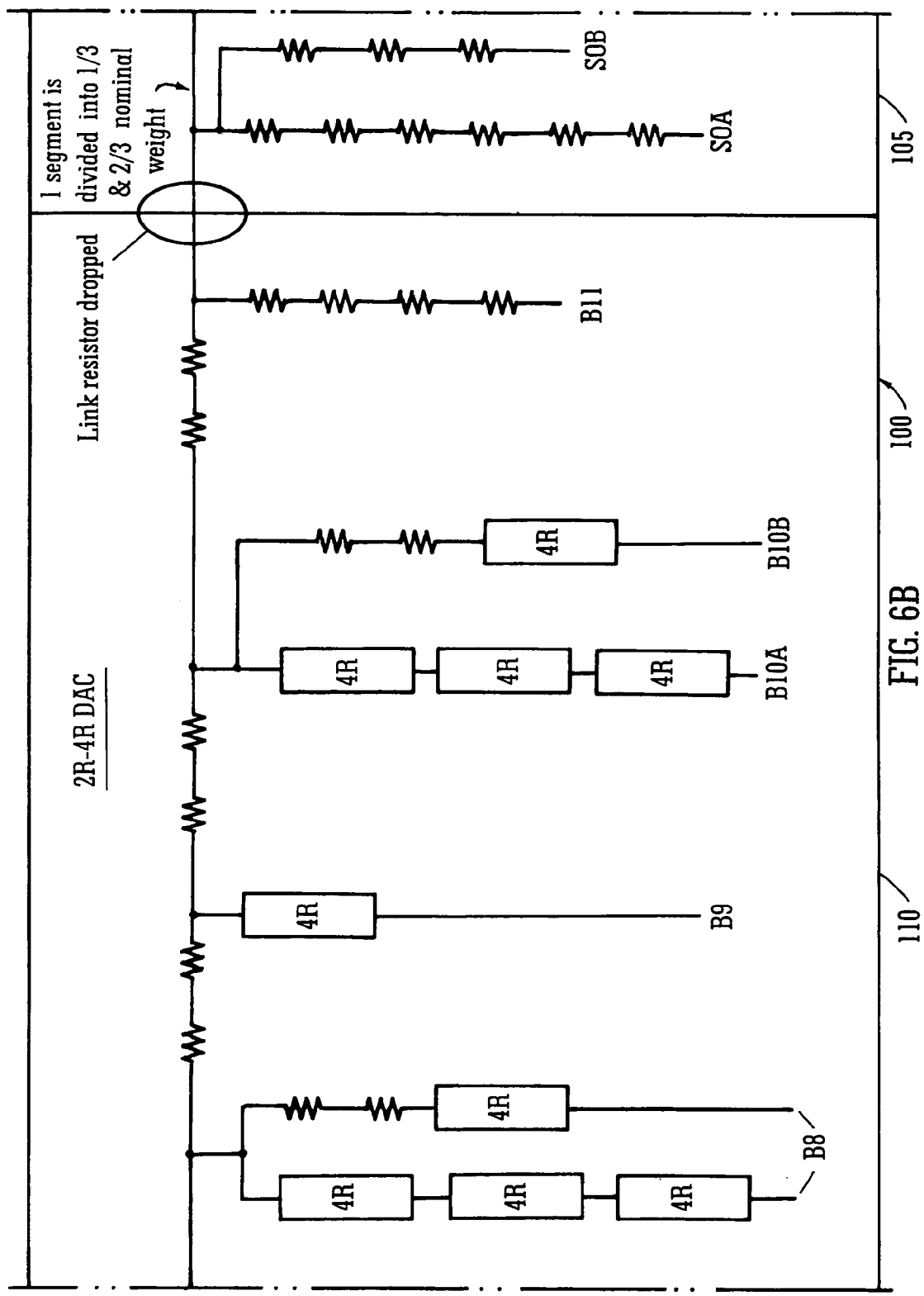
Figure 6C:
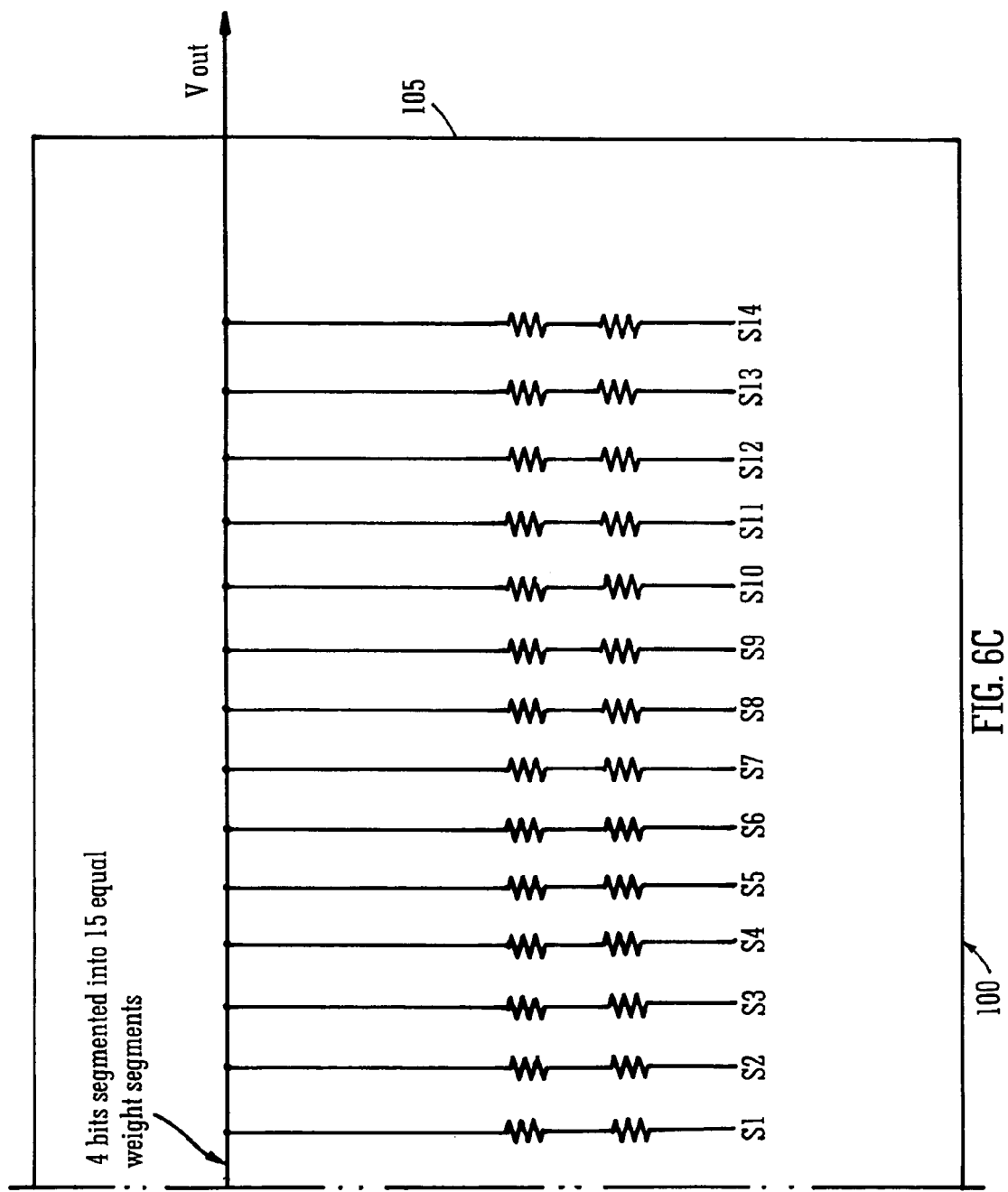

It will be understood that any one of the three embodiments, for example those shown in FIGS. 2, 3 and 4, may be used independently of the others, but in preferred implementations all three are combined. Such an example is shown in the architecture of FIG. 6. For the sake of clarity, FIG. 6 has been subdivided into three sheets shown as FIGS. 6A, 6B and 6C. These can be read in conjunction with one another to view the entire DAC structure. In this embodiment of FIG. 6, the upper part 105 is adapted to provide 4 bits of the input word. These four bits are provided in a segmented architecture with fifteen equal-weighted segments, 14 legs S1 to S14 each having two resistors and one leg/segments (S0) being further divided to provide a set having a first segment of ⅓ nominal weight and the second segment ⅔ the nominal weight. This is provided by 6 resistors in the first leg (Leg S0A) and 3 resistors in the second leg (Leg S0B).

The lower part of the DAC is provided as a modified R-2R architecture with the link resistor between the lower part and the upper part removed, such that the lower legs (legs B1-B11), (i.e. those legs below the region where the link resistor traditionally would have been found), scaled to provide a 2R-4R architecture. The four bits after the segments B11, B10, B9, B8 are alternatively split into the nominal weighting sets of FIG. 2, shown here as ⅓ and ⅔ nominal weighting arrangements. The following seven bits (B7 . . . B1) are provided as a standard 2R-4R implementation. Bit 0 and weights of LSB/2 and LSB/4 are generated by coupling the termination leg to a current source and using the current source to inject currents into the mid point of that leg, i.e. in the mid point of the 4 resistors provided the termination leg. The weights less than 1 LSB are adapted to give extra resolution to the DAC if so required. As an example of the type of current that should be injected into the termination leg to give the desired results, this current source should inject $$Vref/[16R+4swres1]$$

(where swres1=resistance of switch on B1 leg) to give an output change of Lsb/4.

It will be understood that each of the legs (B0-B11 and S0-S14) are switchably coupled to a voltage reference, as is normal for resistor ladder configurations, but for the sake of convenience the individual switch components are not shown.

It will be appreciated that the teaching herein provides for an improved DAC architecture where the improvements may be provided independently or in combination with one another. This teaching is specifically adapted to provide a DAC structure optimized for digital calibration. The goal is achieved this by providing a DAC structure comprising an upper part defining a main part of the DAC architecture and a lower part defining a subDAC part of the architecture. The subDAC part is used to provide a tuning of the upper part of the DAC so as to ensure that for increasing input code applied to the DAC, the DAC provides an output which does not vary by more than 1 LSB. This is achieved by selective switching of the upper and lower parts of the DAC together.

In order to calibrate the DNL & INL errors of a DAC using a digital calibration algorithm the underlying DAC architecture should have resolution greater than the desired resolution of the calibrated output and should also have a means of guaranteeing that there are no gaps in the transfer function (i.e., a means of ensuring no positive DNL errors>1 LSB). These requirements are met by the architectures discussed herein.

Figure 7:
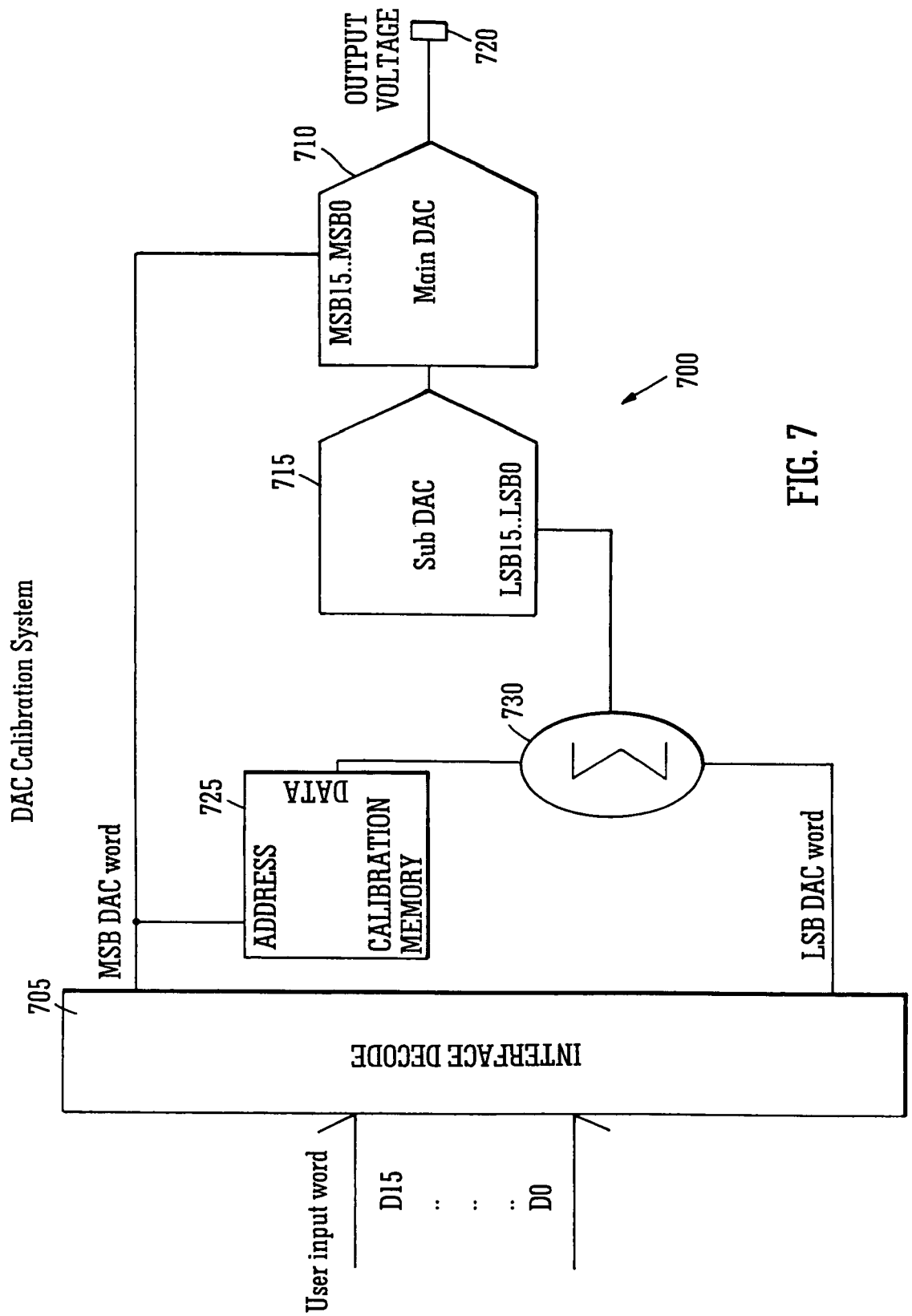
FIG. 7 is a schematic showing an illustrative fourth embodiment.

FIG. 7 shows a schematic of a DAC calibration system 700 provided for practicing the invention. The system provides an apparatus & method for generating a linear, resistor ladder, voltage output DAC in the presence of component matching errors. In this illustrative example a sixteen bit user input word is provided at a interface decode 705, where the MSBs and LSBs of the word are separated.

The DAC 700 including a main-section 710 converting the MSBs of the DAC word into an output voltage and a sub-section 715 converting the LSBs of the DAC word. The sections are coupled together to provide an overall output voltage at an output 720.

The main-section 710 may be provided in a configuration, such as that shown in FIG. 6 as block 105, containing a resistor ladder structured so that it's LSB is less than full-scale of the sub-section 715 but substantially greater than both the LSB of the sub-section & the overall DAC transfer function LSB.

The sub-section 715 also containing a resistor ladder structure, an example of the type of structure being shown as block 110 in FIG. 6.

It will be understood that the ladder structures of the main-section is arranged and the sub-section is scaled so that (in the absence of mismatch) all voltage points in the DAC transfer function (except zero scale (ZS) and full scale (FS)) can be obtained without loading ZS or FS to the sub-section DAC. In this manner it will be apparent that the sub-section DAC uses a reduced code range.

The interface decode is structured to select a main-section & sub-section DAC word for every user input code (except full scale) so that when a main-section code is selected the sub-section is not at zero-scale or full scale. A calibration memory 725, which stores error corrections for each segment of the main-section, is also provided. Selected corrections from the data stored in this memory may be added for each segment of the main-section selected to the LSB word using an adder 730.

During production tests, the error in the segments of the main section is measured and corresponding corrections stored in the memory 725. These corrections are then automatically added to the code loaded to the sub-section depending on the main-section code loaded (i.e. the segments selected in the ladder of the main section).

As will be understood by those skilled in the art, the present invention provides a DAC configuration that can be used to convert a digital input word into an analog voltage output. The illustrated embodiments and principles of operation have been described with reference to an upper and a lower part or a first and second component but it will be appreciated that such nomenclature is used for ease of explanation and it is not intended to limit the protection in any way except as may be deemed necessary in the light of the appended claims. Similarly modifications can be made and will be apparent to those skilled in the art to the exemplary embodiments described herein without departing from the spirit and scope of the present invention.

The words "comprise", "comprises", and "comprising" when used in this specification are to specify the presence of stated features, integers, steps or components but does not preclude the presence or addition of one or more other features, integers, steps, components or groups thereof.

What is claimed is:

1. A digital-to-analog converter (DAC) adapted to convert a digital input word to an analog output voltage signal, the word being divisible into an upper part and a lower part, the DAC including:
   a first component including a resistor ladder DAC controlled by the lower part of the word and generating an output voltage, and
   a second component including a resistor ladder DAC controlled by the upper part of the word and generating an output voltage,
   and wherein the second component is segmented, at least one of the individual segments having a weighting less than 1 LSB of the upper part of the word, the first component being further adapted to tune the output of the second component in response to a selection of a segment of the second component.

2. The DAC as claimed in claim 1 wherein the weighting of at least one of the segments of the second component is less than the total weighting of the lower part of the word.

3. The DAC as claimed in claim 1 wherein the ladder of the first component has an R-2R architecture.

4. The DAC as claimed in claim 3 wherein the ladder of the first component has a scaled R-2R architecture, comprising legs having a plurality of resistors, the legs being separated by link resistors.

5. The DAC as claimed in claim 4 wherein at least one of the link resistors is removed as compared with a conventional R-2R architecture and the remaining leg resistors are scaled consistent with that removal.

6. The DAC as claimed in claim 1 wherein the first component of the DAC is provided with a termination leg, the termination leg being directly coupled to reference signal.

7. The DAC as claimed in claim 1 wherein the first component of the DAC is coupled to a current source, the current source being configured to inject a scaled current into a node of the ladder.

8. The DAC as claimed in claim 7 wherein the injected current is injected to a termination leg of the ladder.

9. A digital-to-analog converter (DAC) for converting a digital input word to an analog output voltage signal, the DAC being provided in a resistor ladder configuration, the ladder including a termination leg coupled to a reference voltage and a plurality of switchable legs each being switchably coupled to a reference voltage, and wherein at least one of the legs of the DAC is additionally coupled to a current source, the current source being adapted to inject an adjustable current into the ladder configuration so as to increase the resolution of the DAC.

10. The DAC as claimed in claim 9 wherein the current injected into the ladder configuration is scaled relative to the reference voltage.

11. The DAC as claimed in claim 9 wherein the ladder is provided as an R-2R ladder configuration, the value of the resistance being provided in the legs being twice the value of the resistance in a portion of the circuit coupling adjacent legs.

12. The DAC as claimed in claim 11 wherein the ladder is subdivided into a first portion and a second portion, each of the first and second portions being provided in a ladder configuration and wherein an upper leg of the first portion is directly coupled to a lower leg of the second portion without a coupling resistor, such that the resistance of the legs in the first portion is a scaled multiple of the resistance of the legs in the second portion.

13. The DAC as claimed in claim 12 wherein at least one leg is segmented.

14. The DAC as claimed in claim 12 wherein the first and second portion of the ladder define a first component of the DAC, the first component being adapted to convert a lower part of an input digital word to an analog voltage output, and wherein the DAC further includes a second component, the second component being adapted to convert an upper part of the input digital word to an analog voltage output and wherein at least a portion of the second component is provided in a segmented structure, at least one of the individual segments having a weighting less than the total weighting of the lower part of the input digital word, the DAC being calibrated such that the first component is adapted to tune the output of the second component in response to a selection of a segment of the second component.

15. A digital-to-analog converter (DAC) adapted to convert a digital input word to an analog output voltage signal, the DAC including a plurality of legs being provided in a resistor ladder configuration, the ladder including a termination leg coupled to a reference voltage and a plurality of switchable legs switchably coupled to a reference voltage, the ladder being subdivided into a first portion and a second portion, each of the first and second portions being provided in a ladder configuration and wherein an upper leg of the first portion is directly coupled to a lower leg of the second portion without a coupling resistor, such that the resistance of the legs in the first portion is a scaled multiple of the resistance of the legs in the second portion.

16. The DAC as claimed in claim 15 further including a current source DAC, the current source DAC being adapted to inject a current into at least one of the legs.

17. The DAC as claimed in claim 16 wherein the current is injected into the termination leg.

18. The DAC as claimed in claim 15 wherein the first and second portion define a lower component of the DAC, the lower component being adapted to convert a lower part of an input digital word to a corresponding output voltage and wherein the DAC further includes an upper component, the upper component being adapted to convert an upper part of the input digital word, and wherein the upper part includes a resistor ladder provided in a segmented architecture at least one leg of the segmented architecture having a weighting less than the total weighting of the lower part of the word, and wherein the DAC is calibrated such that on selection of a segment of the upper part that the lower part is used to tune the output of the upper part.

19. A digital-to-analog converter (DAC) for providing at an output thereof an analog voltage output in response to an input digital code, the converter including:
   a main-DAC section including a resistor ladder structure for converting most significant bits (MSBs) of the input code to a voltage output, a sub-DAC section including a resistor ladder structure for converting least significant bits (LSBs) of the input code to a voltage output, the outputs of the main-DAC and the sub-DAC being combined to provide the output of the DAC, the LSB of the main-DAC being less than the full scale of the sub-DAC but greater than the LSB of the sub-DAC and the overall DAC transfer function LSB;
   an interface decode structured to select a main-DAC and a sub-DAC word for input user codes such that when a main-DAC code is selected the sub-DAC is between zero and full scale, the interface decode separating the input digital code to an MSB DAC word and an LSB DAC word;
   a calibration memory for storing error corrections for the main-DAC, and an adder for adding selected error correction from the calibration memory to the LSB DAC word.

20. The DAC of claim 19 wherein the calibration memory is loaded with error corrections during a production test of the DAC.

21. The DAC of claim 19 wherein the adder is configured to automatically add the corrections to the code loaded to the sub-DAC on selection of a predetermined segment of the main-DAC.

22. A method of converting an input digital word to a corresponding output voltage, the method including the steps of:
   dividing the input word into a lower part and an upper part, converting the lower part of the input word to a corresponding voltage output using a first component of a resistor ladder digital to analog converter (DAC) architecture, converting the upper part of the input word to a corresponding voltage output using a second component of a resistor ladder digital to analog converter architecture, the second part being provided in a segmented structure, using the first component to tune the output of the second component when a segment of the second component is used in the conversion process.

* * * * *